(12) United States Patent
Gupta et al.

(10) Patent No.: US 7,814,456 B2
(45) Date of Patent: Oct. 12, 2010

(54) METHOD AND SYSTEM FOR TOPOGRAPHY-AWARE RETICLE ENHANCEMENT

(75) Inventors: Puneet Gupta, Santa Clara, CA (US); Andrew B. Kahng, Del Mar, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 614 days.

(21) Appl. No.: 11/267,686

(22) Filed: Nov. 4, 2005

(65) Prior Publication Data
US 2006/0110837 A1    May 25, 2006

Related U.S. Application Data

(60) Provisional application No. 60/630,072, filed on Nov. 22, 2004.

(51) Int. Cl.
*G06F 17/50* (2006.01)

(52) U.S. Cl. ................................. 716/19; 716/5; 716/10; 716/20; 716/21

(58) Field of Classification Search ....................... 716/5, 716/10, 19–21; 438/14, 15; 700/90
See application file for complete search history.

(56) References Cited

U.S. PATENT DOCUMENTS

| | | |
|---|---|---|
| 6,194,104 B1 | 2/2001 | Hsu |
| 6,553,559 B2 | 4/2003 | Liebmann et al. |
| 6,578,190 B2 | 6/2003 | Ferguson et al. |
| 6,673,638 B1 | 1/2004 | Bendik et al. |
| 6,749,972 B2 | 6/2004 | Yu |
| 6,795,953 B2 * | 9/2004 | Bakarian et al. .............. 716/5 |
| 2002/0151118 A1 * | 10/2002 | Kamijima .................. 438/149 |
| 2007/0065935 A1 * | 3/2007 | Lindstrom et al. ....... 435/287.2 |

OTHER PUBLICATIONS

Tian et al., "Model-Based Dummy Feature Placement for Oxide Chemical-Mechanical Polishing Manufacturability," ACM, 2000, pp. 667-670.*
Grobman et al., "Reticle Enhancement Technology Trends: Resource and Manufacturability Implications for the Implementation of Physical Designs," ACM, Apr. 1-4, 2001, pp. 45-51.*
Qian et al., "Advanced Physical Models for Mask Data Verification and Impacts on Physical Layout Synthesis," IEEE, Mar. 24-26, 2003, pp. 1-6.*
Grobman et al., "Reticle Enhancement Technology: Implications and Challenges for Physical Design," ACM, 2001, pp. 73-78.*
P. Gupta, A. Kahng, C. Park, K. Samadi, X.Xu, "Wafer Topograpy-Aware Optical Proximity Correction for Better DOF Margin and CD Control." Photo Mask Japan. Apr. 13-15, 2005.
N.B. Cobb and Y. Granik, 'Using OPC to Optimize for Image Slop and Improve Process Window', and published in SPIE Int. Soc. Opt. Eng. 5130, 838, 2003.

* cited by examiner

*Primary Examiner*—Vuthe Siek
(74) *Attorney, Agent, or Firm*—Martine Penilla & Gencarella, LLP

(57) ABSTRACT

The present invention provides a method and system for improving reticle enhancement calculations during manufacture of an integrated circuit (IC). The reticle enhancement calculations are improved by incorporating post-planarization topography estimates. A planarization process of a wafer layer is simulated to estimate the post-planarization topography. RET calculations, such as sub-resolution assist feature insertion, optical proximity corrections and phase shifting are then performed based on the post-planarization topography of the wafer layer.

18 Claims, 9 Drawing Sheets

METHOD AND SYSTEM FOR TOPOGRAPHY-AWARE RETICLE ENHANCEMENT

This application claims priority to Provisional Application 60/630,072, filed Nov. 22, 2004, entitled System and Method for Topography-Aware Reticle Enhancement.

BACKGROUND OF THE INVENTION

1. Field of the Invention

The present invention relates to the field of semiconductor circuits and, in particular, to a method and system for improving the manufacturing process of an integrated circuit (IC).

2. Description of the Related Art

In an IC fabrication process, optical lithography using one or more photomasks is applied to transfer designed circuit patterns onto a given wafer layer (e.g., active area, transistor gate polysilicon, contact, Metal-1, etc.) of an integrated circuit (IC). These circuit patterns represent layout features of the IC. Over the past few years, the dimensions of the layout features in ICs have been reduced to achieve greater circuit operating frequencies and increased integration densities. With reduced dimensions, advanced photomasks have been used to enhance fidelity of the manufactured circuit patterns to the designed circuit patterns on each wafer layer of the IC. Advanced photomasks embody Reticle Enhancement Techniques (RETs), such as sub-resolution assist features (also known as "scattering bars"), optical proximity correction, alternating-aperture phase-shifting, and the like. These techniques compensate for changes in the size and shape of the pattern that occur during the pattern transfer from the photomask(s) to the wafer layer. These changes are due to various manufacturing non-idealities, including optical effects such as scattering of light, as well as focus variations (i.e., variations in the distance between a lens and the wafer layer).

Present-day RET techniques assume a constant value of focus variation (for example, "zero defocus" corresponds to ideal or nominal focus conditions) for all RET calculations for features on the wafer layer. However, with advanced lithographic processes and small feature dimensions, imperfect planarity—i.e., topographic variation—of wafer layers has become a major cause of focus variation in the succeeding layers to be manufactured. The wafer topographic variation occurs both systematically and randomly within the layout region of the IC; in particular, the systematic component of such variation is reproduced in each copy of the IC on the wafer. The wafer topographic variation also occurs in spite of such manufacturing techniques as chemical-mechanical planarization (CMP), since the result of such techniques varies with the local layout pattern of the IC. Here, locality is at length scales of between several tenths of a micron and several thousand microns. In other words, the post-CMP topographic height of the wafer depends on the layout pattern context out to a radius of from tenths to thousands of microns. The thickness or underlying topographic variations of a given wafer layer of the IC are not only highly significant relative to the focus control that is required for accurate lithography, but are also largely systematic and predictable.

One method to reduce the topographic variations within a given IC is the technique of dummy fill insertion. Dummy fill insertion entails the addition of non-functional, extra ("dummy") shapes to the originally designed layout, so as to enhance the uniformity of layout feature density and hence the uniformity of planarization of a wafer layer. However, even after dummy fill insertion, many topographic variations remain in the wafer layer within the boundary of the IC. These topographic variations, by causing variations in focus, affect the critical dimensions of the layout features that are to be patterned on the wafer layer. The critical dimensions of a given layout feature include the length and width of the feature.

U.S. Pat. No. 6,673,638, titled "Method and Apparatus for the Production of Process Sensitive Lithographic Features", filed on Jan. 28, 2002, and assigned to KLA-Tencor Corporation, proposes defocus test structures on a reticle to model variations of critical dimensions of a circuit pattern to be printed on a wafer layer. This modeling is done with respect to the shape and spatial parameters of an IC layout.

U.S. Pat. No. 6,194,104, titled "Optical Proximity Correction Method for Improving Lithography Process Window", filed on Oct. 12, 1999, and assigned to Taiwan Semiconductor Manufacturing Company, proposes a method for optical proximity correction (OPC) of photomask aperture shapes used for photolithographic patterning. The OPC shapes are derived by mathematically modeling contours to be printed on a wafer layer.

A publication titled "Using OPC to Optimize for Image Slope and Improve Process Window", by N. B. Cobb and Y. Granik, and published in SPIE Int. Soc. Opt. Eng. 5130, 838, 2003, proposes a method to solve for OPC at a non-zero defocus value to increase depth of focus. The method minimizes an objective that is a function of edge placement error, i.e., the error that occurs while transferring the pattern to a wafer layer.

The methods and systems cited above do not take into account systematic and predictable post-planarization topographic variations of the wafer surface. Yet, such wafer topographic variations affect focus in a lithography process which in turn affects patterning accuracy and manufacturing yield—both functional and parametric—of the IC. In light of the above discussion, there is a need for a system and method that will account for topographic variations in a wafer layer when calculating RETs such as sub-resolution assist features (SRAFs) or OPC. Further, the layout of any given IC layer should be optimized based on the predicted effects of wafer topography on focus and lithographic patterning accuracy.

SUMMARY OF THE INVENTION

An object of the invention is to combine post-planarization topography of a wafer layer within an IC with RET calculations.

Another object of the invention is to reduce the critical dimension error induced by a non-planar topography of a wafer layer.

Another object of the invention is to optimize an IC layout based on the topography of a wafer layer.

Still another object of the invention is to improve the performance characteristics of integrated circuits (ICs).

Yet another object of the invention is to increase parametric yield in manufactured ICs.

To achieve the above said objectives, the present invention provides a method, system and a computer program product for reticle enhancement during manufacture of an integrated circuit. A planarization process of the wafer layer within an IC is simulated to estimate a post-planarization topography of the wafer layer within the relevant manufacturing context. (Here, manufacturing context includes neighboring copies of the IC or other ICs on the manufactured wafer, within the distance that defines locality of pattern effects on post-planarization wafer topography. In a high-volume manufacturing context, a plurality of copies of the IC are typically printed in an array on each silicon wafer. Or, in a low-volume manufacturing context, the IC may be printed next to other, different ICs in what is referred to as a multi-project wafer or "shuttle" context.) The post-planarization topography of a wafer layer in the IC gives the values of thickness variations from nominal. To enable more accurate, topography-aware OPC, an IC layout is then partitioned into at least one defocus marking layer (DML) based on local defocus values. The local defocus values are calculated based on thickness variations within the bounded IC wafer layer. Reticle enhancement technique (RET) calculations, such as for OPC or SRAF insertion, are then performed for each DML using different RET models.

The incorporation of predicted topographic variations underlying a given wafer layer of the IC during RET calculations improves the design of the photomask(s) for the given wafer layer. In other words, the predicted topographic variation leads to predicted defocus values, and by assigning individual features of the IC layout to specific DMLs, the OPC, SRAF or other RET calculations of the photomask layout become more accurate. This considerably reduces the errors in transfer of an IC layout onto a wafer layer. The topographic variations are incorporated taking into account design objectives, such timing delay and power, thereby improving the performance of the integrated circuit. Further, the method increases the parametric yield in the manufactured IC.

BRIEF DESCRIPTION OF THE DRAWINGS

So that the manner in which the above recited features of the present invention can be understood in detail, a more particular description of the invention, briefly summarized above, may be had by reference to various embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Various embodiments of the present invention provide a method, system, and a computer program product for reticle enhancement during manufacture of an integrated circuit (IC). A post-planarization topography of a wafer layer on the IC is estimated. Reticle enhancement technique calculations (RET) such as optical proximity correction and phase-shifting are performed taking into consideration the post-planarization topography of the wafer layer, thereby increasing the parametric yield in the manufactured IC.

Figure 1:
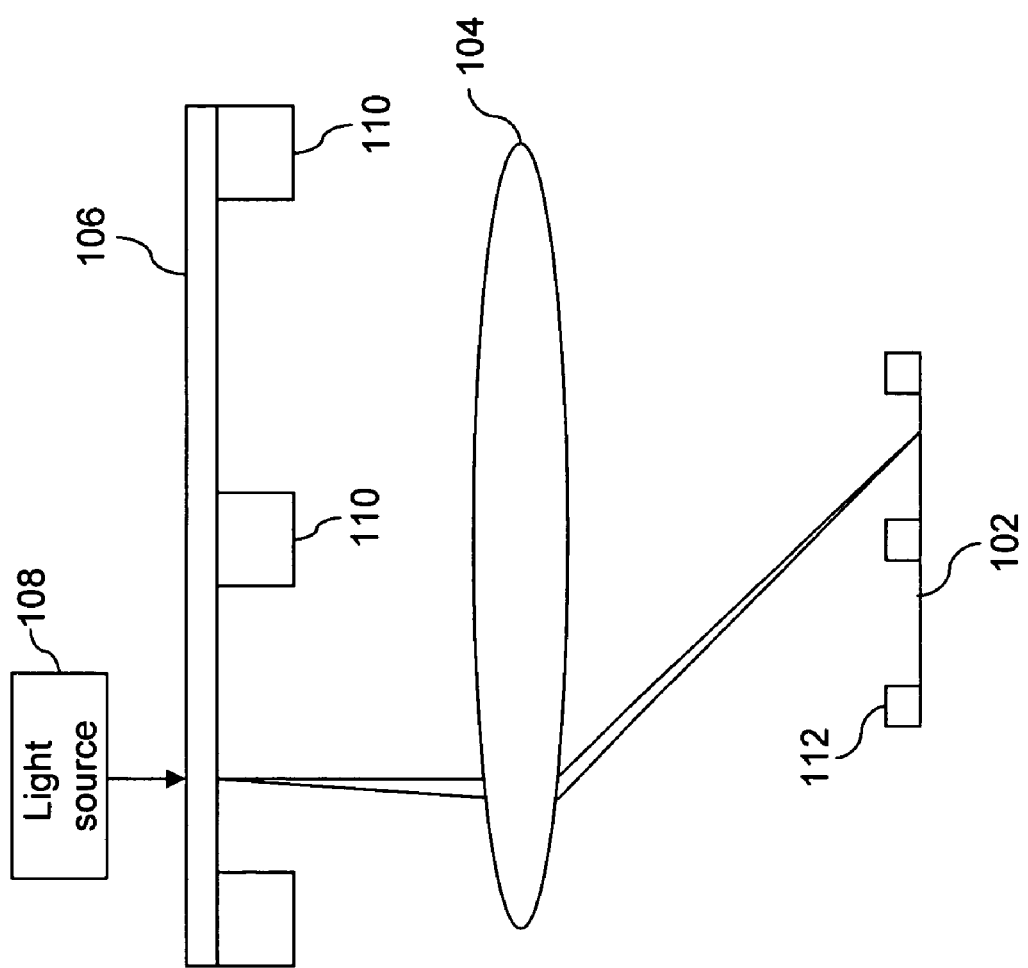
FIG. 1 is block diagram illustrating an optical lithographic system, in accordance with an embodiment of the invention.

FIG. 1 is a block diagram illustrating an optical lithographic system 100, in accordance with an embodiment of the invention. Optical lithographic system 100 creates a reduced circuit pattern image on a wafer layer 102 during lithography. Optical lithographic system 100 includes a lens 104, a reticle 106, and a light source 108.

Wafer layer 102 is a semiconductor layer on which an IC is to be created. The IC layout represents patterns of IC devices to be printed as part of a single chip on wafer layer 102. Wafer layer 102 is coated with a photosensitive resist material sensitive to radiation. Lens 104 is a convex lens which focuses radiations on to the surface of wafer layer 102. The perpendicular distance between lens 104 and wafer layer 102 is referred to as the focus. Light source 108 generates radiations which transfer energy into photoresistive material on the wafer surface to create the pattern image on wafer layer 102. Reticle 106 is a patterned shield, also referred to as a photomask. The reticle 106 has opaque regions 110 conforming to the IC layout to be printed. Opaque regions 110 do not allow the radiations to pass through reticle 106.

As noted above, radiations generated by light source 108 pass through portions of reticle 106 between opaque regions 110. The light radiations passing through are focused by lens 104 onto wafer layer 102. In this process, the image transferred from the reticle to the wafer is reduced by the lens, typically by a factor of 4 or more. Radiations blocked by opaque regions 110 do not impinge on the photoresist on wafer layer 102. This generates a contrasting image 112 on wafer layer 102, conforming to the pattern of opaque regions 110. However, due to optical effects such as scattering of light, diffraction of light, and focus variations, the exact pattern is not printed on wafer layer 102. For example, a rectangular pattern on the reticle may be printed as an oval on the wafer layer because edges have a tendency to round off due to diffraction. Hence, reticle enhancement techniques (RET) such as sub-resolution assist features (SRAFs), optical proximity correction (OPC) and phase-shifting are used to compensate the above-mentioned optical effects.

OPC is a process of modifying circuit patterns to be printed on a wafer layer so that the circuit patterns are printed accurately on the wafer layer. For example, shapes of opaque segments 110 are distorted to compensate for the amount of pattern change caused by proximity effects, such as closed contacts, shortened or rounded lines, and the like. Different techniques can be used for performing OPC calculations. In one embodiment of the invention, OPC calculations are rule based. In rule based calculations, geometric rules are used for making corrections in the shapes of optical segments 110 on reticle 106. In another embodiment of the invention, OPC calculations are simulation or model based. In model based calculations, the process of optical lithography is simulated and accordingly the shapes of optical segments 110 are modified to improve the simulated and, by extension, the actual manufactured circuit patterns. Sub-resolution assist features (SRAFs), which are non-printing apertures that beneficially modulate diffraction effects, are typically considered to be yet another form of OPC; the calculations of size and location of SRAFs can be either rule-based or model-based. However, OPC calculations presently do not take into account the thickness variations in wafer layer 102. The method for incorporating the thickness variations in wafer layer 102 is explained in conjunction with FIG. 3 and FIG. 4.

Figure 2:
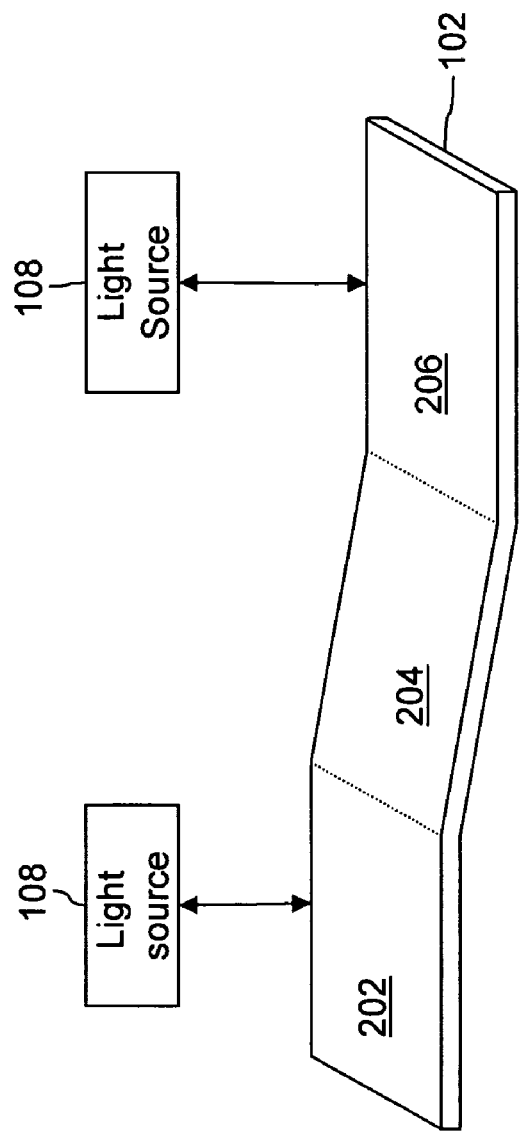
FIG. 2 is a schematic representation of a portion of the wafer layer within a single IC illustrating thickness variations, in accordance with an embodiment of the invention.

FIG. 2 is a schematic representation of wafer layer 102 illustrating thickness variations across an IC, in accordance with an embodiment of the invention. Wafer layer 102 is planarized to produce a smooth wafer surface. The smooth surface is necessary to maintain a depth of focus constraint, i.e., the maximum tolerable focus variation during manufacturing. The depth of focus constraint helps in transferring the designed pattern image accurately onto wafer layer 102. However, wafer layer 102 can have topographic variations within the boundary of a given IC as a result of uneven pattern density and CMP processes on underlying wafer layers. As shown in FIG. 2, wafer layer 102 has a non-planar topography. Wafer layer 102 has three portions, hereinafter referred to as portions 202, 204 and 206. Due to the non-planar topography of wafer layer 102, portions 202, 204, and 206 have different focus values. This means the distance between lens 104 and wafer layer 102 is not uniform. The amount of variation in the focus value is referred to as defocus. The defocus values of portions 204 and 206 are calculated with reference to the defocus value of portion 202. For example, assume portion 202 is taken as having a defocus value of zero, and portion 206 relative to portion 202 has a defocus value of −0.1 μm. Hence, with a depth of focus value of ±0.3 μm for wafer layer 102, portion 202 has a depth of focus value in the range of −0.3 μm to +0.3 μm, and portion 206 has a depth of focus value in the range of −0.4 μm to +0.2 μm. This creates variations in critical dimensions (CD) of the pattern to be printed on portion 206. The CDs include the width and length of the pattern to be printed on a wafer layer.

Figure 3:
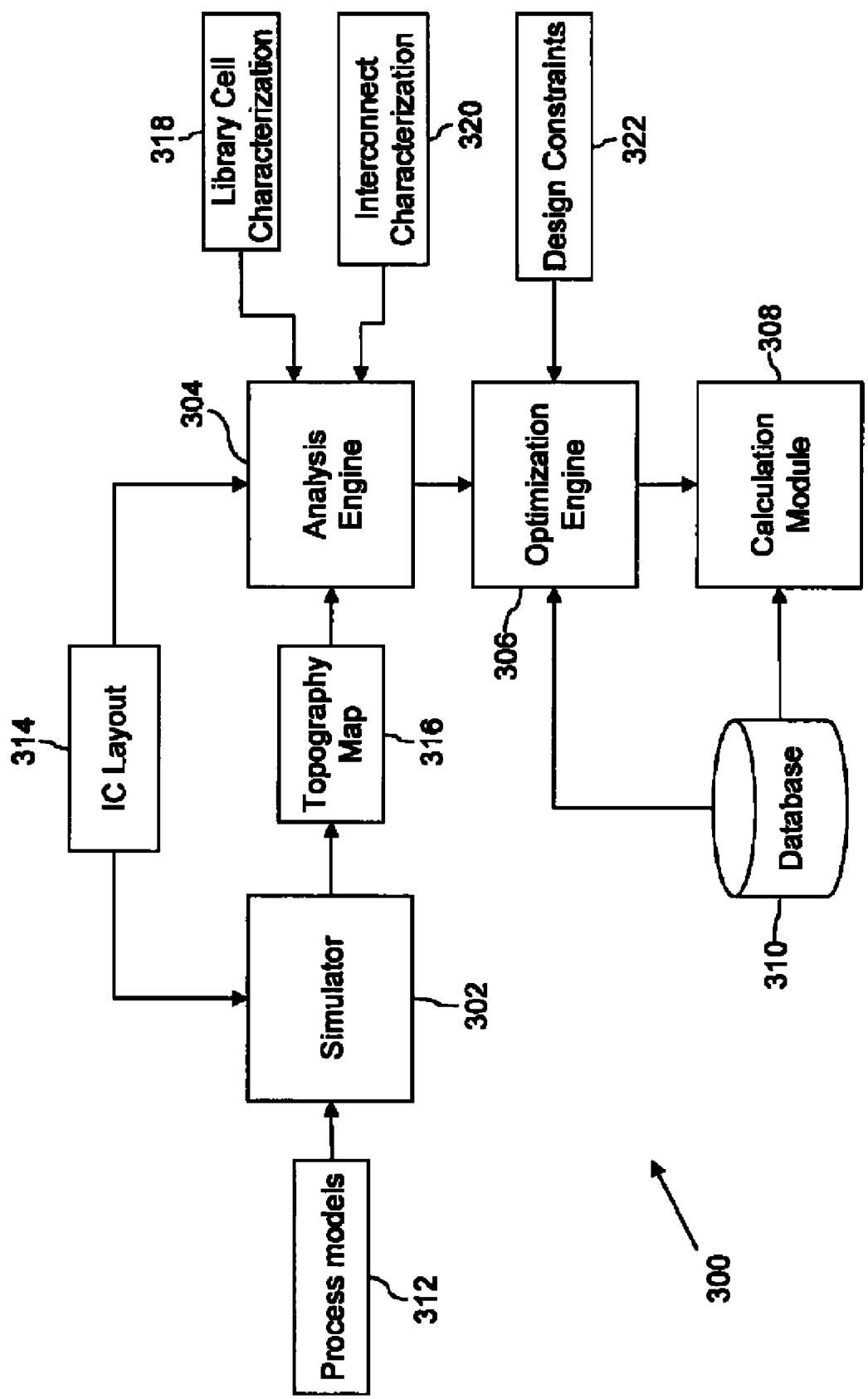
FIG. 3 is a block diagram of a system for reticle enhancement during manufacture of an integrated circuit, in accordance with an embodiment of the invention.

FIG. 3 is a block diagram of a system 300 for reticle enhancement, in accordance with an embodiment of the present invention. System 300 includes a simulator 302, an analysis engine 304, an optimization engine 306, a calculation module 308, and a database 310.

Simulator 302 generates a post-planarization topography map 316 of the wafer layer 102 within the boundary of an IC based on process models 312 and an IC layout 314. Process models 312 are mathematical models of the processes used for planarization of wafer layer 102. For example, process models 312 may include commercially available mathematical models of chemical-mechanical planarization (CMP) such as from Praesagus, Inc. or CHAMPS from Samsung, Inc. CMP is a process used for planarization of wafer layers. A topography map is a map of z coordinate at every (x, y) coordinate on a wafer layer, i.e., the topography map represents the thickness profile or flatness of the bounded wafer surface. IC layout 314 represents the schematic arrangement and connections of microelectronic devices, such as Metal Oxide Semiconductor Field Effect Transistors (MOSFETs), Bi-polar Junction Transistors (BJT), logic gates and metal interconnections to make a circuit on wafer layer 102. Each shape that forms a microelectronic device (e.g., a polysilicon shape or a diffusion shape), that forms an interconnect (e.g., a polysilicon shape or a via shape or a contact shape or a metal interconnect shape), or that forms another shape (e.g., a CMP dummy fill shape or an etch dummy fill shape or a spare/bonus shape) that is to be intentionally created on wafer layer 102 is referred to as a layout feature. Further, the minimum linewidth in the layout (e.g., the channel length of a MOSFET on the polysilicon gate layer of the IC) is referred to as the feature size.

Analysis engine 304 partitions the bounded wafer layer 102 into one or more defocus marking layers (DMLs) based on topography map 316 and IC layout 314. Each DML corresponds to a range of defocus values. Analysis engine 304 also uses other parameters based on, for example, a library cell characterization 318 and an interconnect characterization 320 for partitioning wafer layer 102 into DMLs. Library cell characterization 318 represents parameters of a cell, such as delay, power, leakage, gate capacitance, and the like. The cell represents a small subcircuit of microelectronic devices and/or interconnects to be created on wafer layer 102. Interconnect represents the metal wires, as well as contacts and vias, connecting the cells. Interconnect characterization 320 captures such parameters as resistance, capacitance, and inductance of interconnects in the IC layout 314.

Optimization engine 306 optimizes the number of DMLs on wafer layer 102 based on available RET models and design constraints 322. The ability to optimize parametric yield or patterning accuracy depends on the specific defocus ranges of DMLs that are available, as well as the number of such DMLs. The specific number and defocus ranges of the DMLs in turn depend on the topography map, the interactions between the topography map and the design layout, and the RET models and design constraints. For example, having more DMLs can improve accuracy of OPC (scattering-bar, bias OPC, model-based OPC, etc.) for any feature that is assigned to a DML, but can also potentially harm accuracy if too many pairs of closely-proximate features are assigned to different DMLs. Further, OPC accuracy can be more valuable for performance-critical devices and interconnects, and less valuable for non-performance-critical features. Design constraints 322 include various parameters such as setup timing slack, hold time slack, total negative timing slack, total leakage power, maximum clock frequency, signal integrity, and the like. RET models are mathematical and empirical models used to perform reticle enhancement calculations, such as SRAF insertion, OPC and phase-shifting. Database 310 stores the RET models. Each defocus value has a corresponding RET model. Calculation module 308 performs RET calculations for each DML based on the available RET models.

In one embodiment of the invention, system 300 is a part of a photolithography tool. For example, existing means of adaptively adjusting focus (i.e., distance between lens and wafer surface) inside a stepper or scanner tool can be enhanced by the more fine-grain, design-aware partitioning of the layout into DMLs. In another embodiment of the invention, elements of system 300 are a part of an Electronic Design Automation (EDA) tool. In various embodiments of the invention, the elements of system 300, such as simulator 302, analysis engine 304, optimization engine 306 and calculation module 308, are implemented as software, hardware modules, or a combination thereof.

Figure 4:
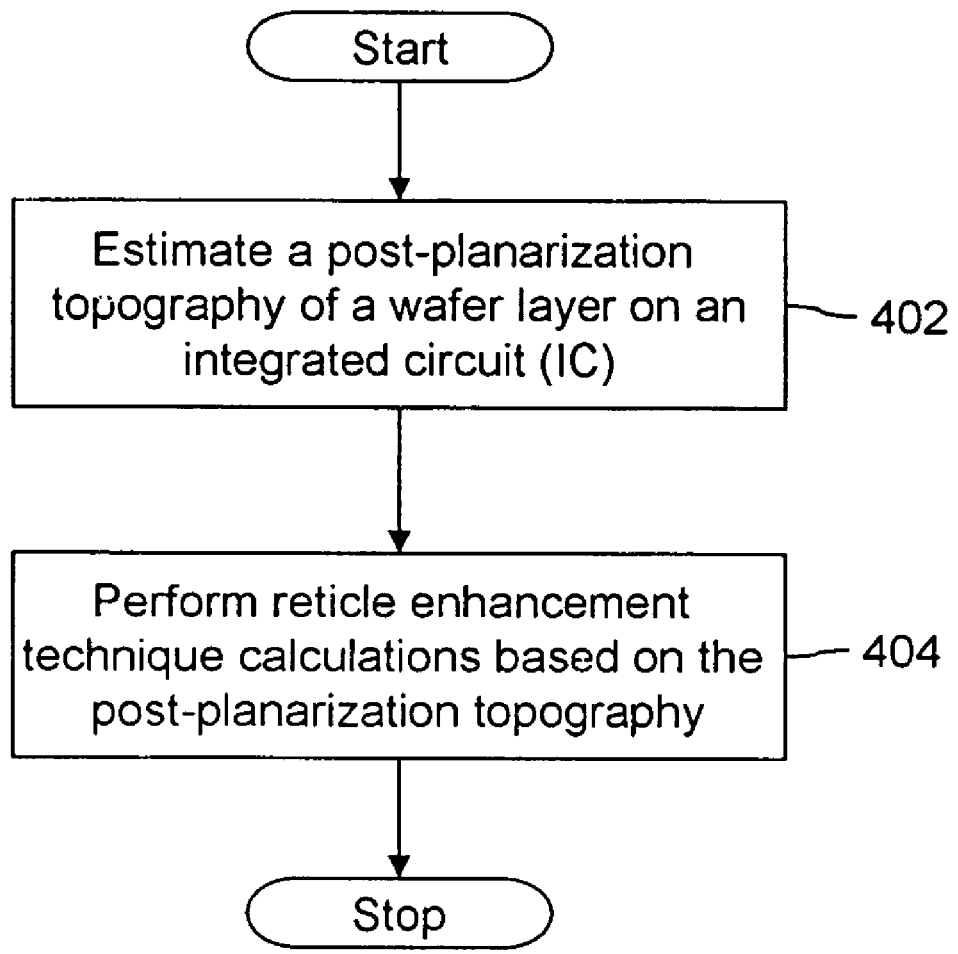
FIG. 4 is a flowchart illustrating a method for reticle enhancement, in accordance with another embodiment of the invention.

FIG. 4 is a flowchart illustrating a method for reticle enhancement, in accordance with an embodiment of the invention. At step 402, a post-planarization topography of a wafer layer of an integrated circuit (IC) is estimated to form a post-planarization topography map. The post-planarization topography map is estimated by simulating a planarization process of the wafer layer. The topography map associates a height with each layout feature. The height represents the thickness variation in the wafer layer. In one embodiment of the invention, the topographic map is a table of thickness values for every grid square in the IC layout. An exemplary grid square has a side of length 20 microns. The simulation can be a coarse or a discrete simulation, i.e., the thickness variations in the wafer layer are estimated in intervals.

In one embodiment of the invention, the chemical-mechanical planarization (CMP) process is simulated to compute a topographic map of the wafer layer. The CMP process is an abrasive process using chemical slurries and a circular action to polish the surface of the wafer layer. Commercial simulation software, such as CLIP, Champs, and Automated surface profile analysis tools are available for CMP process simulation.

In one embodiment of the invention, the post-planarization topography map is estimated by using mathematical models. An exemplary mathematical model is that described in a Ph.D. thesis titled "Chip-scale Modeling of Pattern Dependencies in Copper Mechanical Polishing Processes", by T. A. Tugbawa, submitted to the Massachusetts Institute of Technology in 2002. Further, the post-planarization topography is estimated during the design process, e.g., during the placement and routing stage, during the parasitic extraction and performance analysis stages, during the manufacturability check stage, or any combination of these stages. Thereafter, at step 404, RET calculations are performed based on the post-planarization topography map of the wafer layer, i.e., RET calculations are performed for each interval of the wafer layer for which the thickness variations are estimated.

Figure 5:
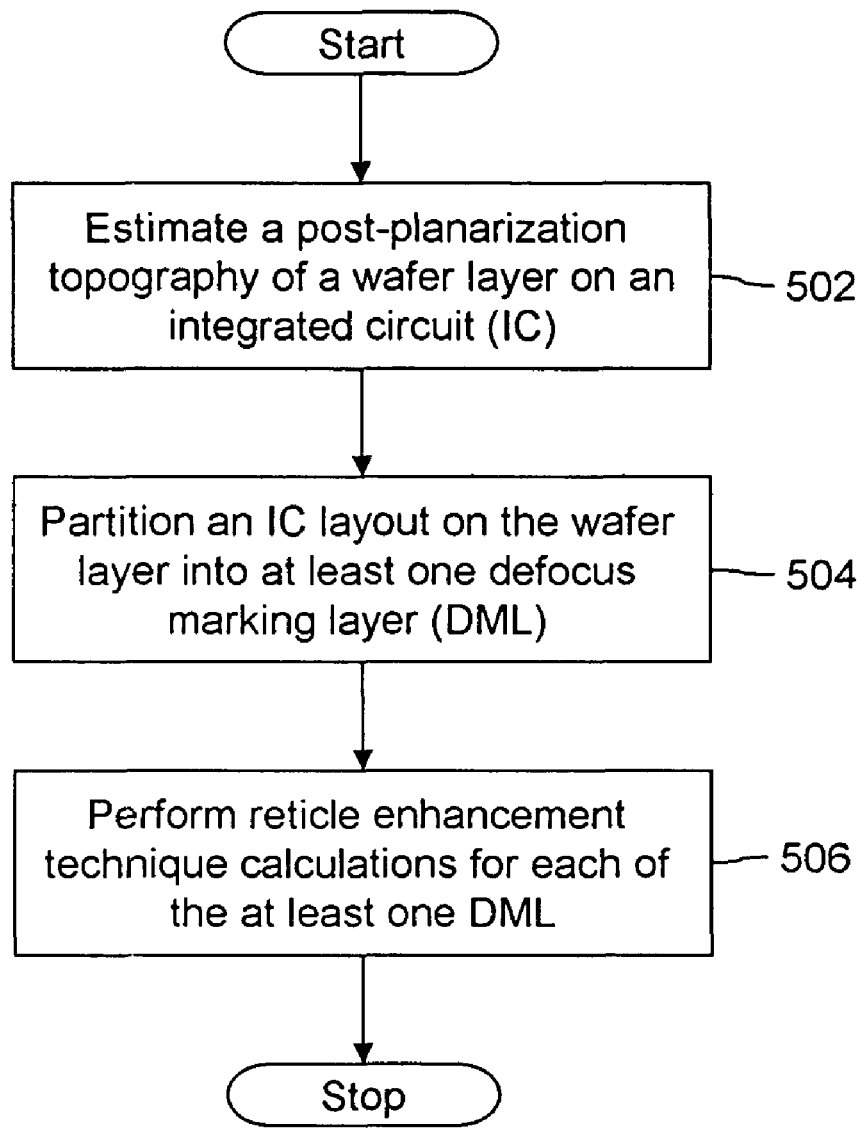
FIG. 5 is a flowchart illustrating a method for reticle enhancement, in accordance with another embodiment of the invention.

FIG. 5 is a flowchart illustrating a method for reticle enhancement, in accordance with another embodiment of the invention. At step 502, a post-planarization topography of the top wafer layer of an integrated circuit (IC) is estimated to form a post-planarization topography map. The post-planarization topography map is estimated by simulating a planarization process of the wafer layer. The simulation is a continuous simulation, i.e., the thickness variations are estimated in a continuous manner along the length of the wafer layer. In one embodiment of the invention, a CMP process is simulated to compute the topographic map of the wafer layer. Thereafter, at step 504, the IC layout on the wafer layer is partitioned into at least one defocus marking layer (DML). Each defocus marking layer corresponds to a different range of defocus values. Each layout feature is associated with a defocus marking layer. At step 506, reticle enhancement technique (RET) calculations are performed for each of the at least one DML. RET models are used for these calculations. All IC layout features on a DML are treated with a RET model that is tuned to a particular defocus value specific to that DML. In one embodiment of the invention, the RET treatment involves OPC calculations. The OPC calculations are based on optical model parameters, such as, wavelength, illumination, numerical aperture, and partial coherence. In one embodiment of the invention, the RET treatment involves calculation of sub-resolution assist feature sizes and locations.

In one embodiment of the invention, repeated or identical patterns in the IC layout are identified. RET calculations for each repeated or identical pattern on a DML is performed only once. The results are used whenever repeated or identical patterns are identified.

Figure 6:
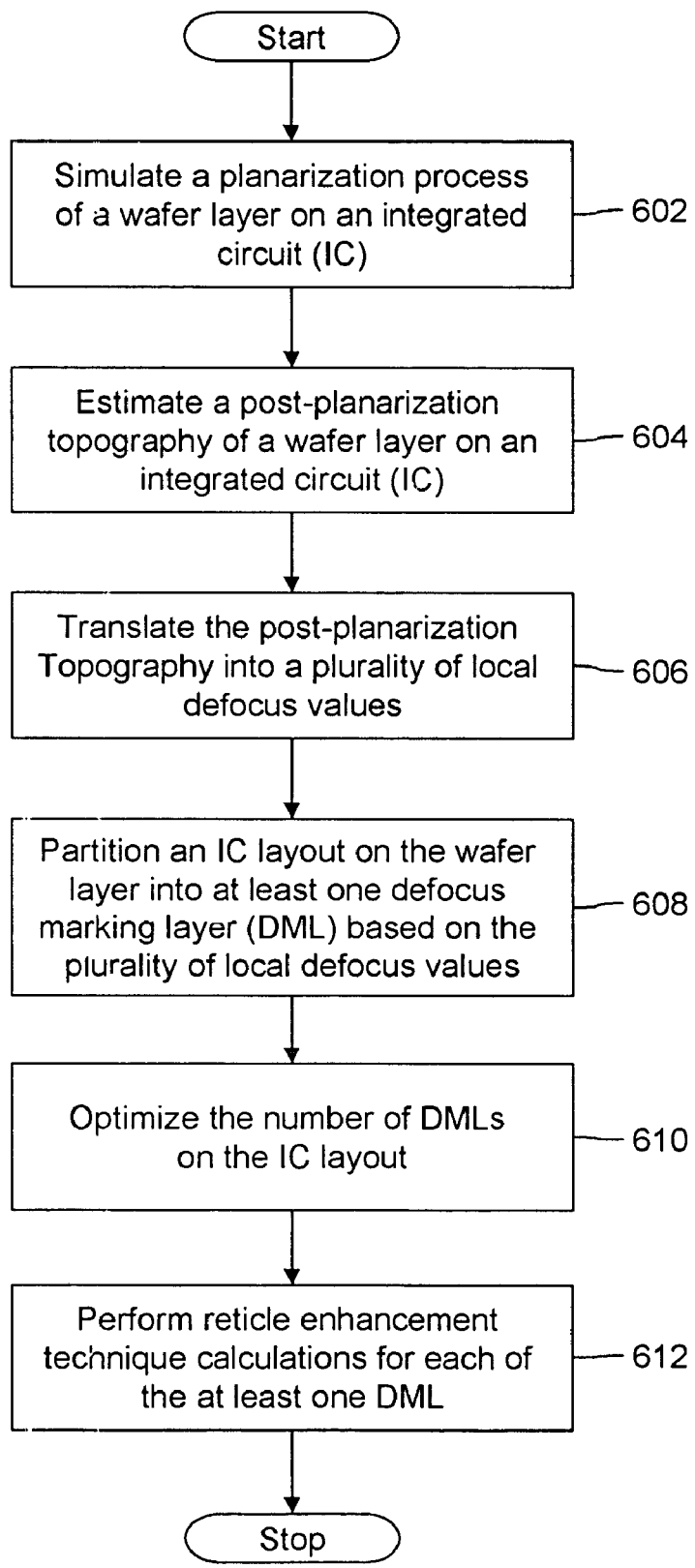
FIG. 6 is a flowchart illustrating a method for reticle enhancement, in accordance with another embodiment of the invention.

FIG. 6 is a flowchart illustrating with additional detail a method for wafer topography-aware reticle enhancement, in accordance with another embodiment of the invention. At step 602, a planarization process of a wafer layer on an integrated circuit (IC) is simulated. In one embodiment of the invention, a chemical-mechanical planarization (CMP) process is simulated. The CMP is simulated based on the mathematical models of the process and the IC layout to be printed on the wafer layer. The IC layout data is represented using, for example, the GDSII Stream format. At step 604, a post-planarization topography map of the wafer layer is estimated based on the simulation of the planarization process. Thereafter, at step 606, the post-planarization topography map is translated into a plurality of local defocus values. At step 608, the IC layout on the wafer layer is partitioned into at least one DML based on the plurality of local defocus values. The DMLs reflect the estimated post-planarization topography of the wafer layer. Each DML corresponds to a range of defocus values. The partitioning is done such that every layout feature is associated with a defocus marking layer and hence a defocus value. Further, design objectives and constraints pertaining to such parameters as signal delay, signal integrity, setup timing slack or leakage power may be used to guide the partitioning into DMLs. These design objectives and constraints are taken into consideration as they govern the performance of the integrated circuit and hence the parametric yield achieved by manufacturing.

The incorporation of design constraints is illustrated by the following example. As previously discussed with respect to FIG. 2, if portion 202 and portion 206 have a defocus value of +0.1 μm and −0.1 μm, respectively, portion 202 and portion 206 have almost the same behavior with respect to the geometric linewidth variations caused in the pattern to be imprinted on the wafer layer due to optical effects. However, the topographic variations are partly or fully compensated by the planarization process on the wafer layer. Therefore, the thickness of the deposited material (e.g., copper) would be different even if the defocus value has the same magnitude. For example, portion 202 may have less copper thickness and more dielectric thickness than portion 206. Therefore, −0.1 μm and +0.1 μm topography will have different power and performance even though they may have the same linewidth. As a result, for example, for setup timing, portion 202 may have more delay as compared to the delay of portion 206. Hence, for setup timing, portion 202 and portion 206 may be considered in separate DMLs. In this manner, partitioning of the wafer layer into DMLs can be based on the design objectives. Further, design objectives may make topographic variations more important for certain features. For example, if the thickness of both portion 202 and portion 206 is reduced with a change in focus, portion 202 will be more critical than portion 206 as the reduction in thickness may lead to further increase in delay.

Continuing with this example pertaining to FIG. 6 and the optimization 610 of the number of DMLs, we observe that the number of DMLs on the wafer layer also depends on the spatial proximity of layout features, i.e., features at the border between two DMLs. This is because the features within the range of the spatial proximity have a changing defocus value, causing error in model-based RET calculations. In one embodiment of the invention, for the features at the border between two DMLs, an RET model corresponding to an average defocus value of the two DMLs is used instead of applying two different RET models to the features on a boundary. The use of an RET model corresponding to an average defocus value decreases the OPC error and hence the CD variation of the boundary features, relative to the strategy of using two different models. For example, OPC may seek to correct one pattern at the boundary of a 0.1 μm DML region, and in doing so needs to reference images of other patterns in an adjacent 0.2 μm DML region. In such a situation, all patterns on the DMLs of 0.1 μm and 0.2 μm defocus are treated with an RET model corresponding to an average defocus of 0.15 μm. The use of average defocus values reduces distortions in CD. In another embodiment of the invention, all pairs of layout features for which inter-feature distance is less than the optical radius of the lithography process are assigned to the same DML. The number of DMLs on the wafer layer also depends on RET models, since only a finite number of RET models are available, and each DML corresponds to a distinct RET model.

Through the optimizations implicit in step 610, a number of DMLs on the wafer layer is determined based on the above-mentioned design objectives and constraints. Further optimizations may be performed to minimize the number of pairs of layout features that are in close proximity and are yet assigned to different DMLs. To this end, various known algorithms such as graph partitioning, maximum flow, and matching techniques may be used for partitioning and optimizing the layout mapping to DMLs.

An exemplary graph partitioning algorithm for optimizing the assignment of layout features to DMLs creates an undirected graph N=(V, E) where V is a set of vertices and E is a set of weighted edges between the vertices. Each vertex represents a layout feature with a height function obtained from a topography map of a wafer layer. A weighted edge between two vertices indicates that the inter-feature distance of the corresponding layout features is less than the optical radius of the lithography process. The weight of an edge is given by the ratio of the optical radius of the lithography process and the inter-feature distance of the corresponding layout features.

The height function ranges from a minimum value to a maximum value. This range is divided into (2k-2) intervals using a set of (2k-2) DML threshold values, where k represents the number of DMLs. The DML threshold values are represented by $Th_1, Th_2, \ldots, Th_{2k-2}$. Depending on the values of the height function, layout features are assigned to the intervals. For example, a vertex will be assigned to the $i^{th}$ interval if the value of its height function lies between $Th_{2i-2}$ and $Th_{2i-1}$. Further, each remaining vertex is either assigned to the $i^{th}$ interval or the $(i+1)^{th}$ interval such that the sum of the weights of the edges connecting the layout features is minimized. In one embodiment of the invention, DML threshold values are calculated based on the complete range of thickness variation. For example, the complete range of thickness variation on the wafer layer is divided into equal intervals. These values are used as threshold values. In another embodiment of the invention, DML threshold values are calculated based on available defocus RET models. For example, if the defocus models available are at 200 nm, 500 nm and 600 nm, then the thresholds are chosen with respect to the RET models.

Thereafter, at step 612, reticle enhancement calculations are performed for each DML using a defocus-specific RET model.

In one embodiment of the invention, the topography map and the design constraints determine a preferential ranking of an RET model to be used for each layout feature. For example, if two RET models representing +100 nm of defocus and +160 nm of defocus are available, and the topography map shows an anticipated defocus of +120 nm for a layout feature, then an RET model having +100 nm of defocus will be preferred over RET model having +160 nm of defocus. This is because the RET model representing +100 nm of defocus is closer to the anticipated defocus of +120 nm, as compared to the RET model representing +160 nm of defocus.

Figure 7:
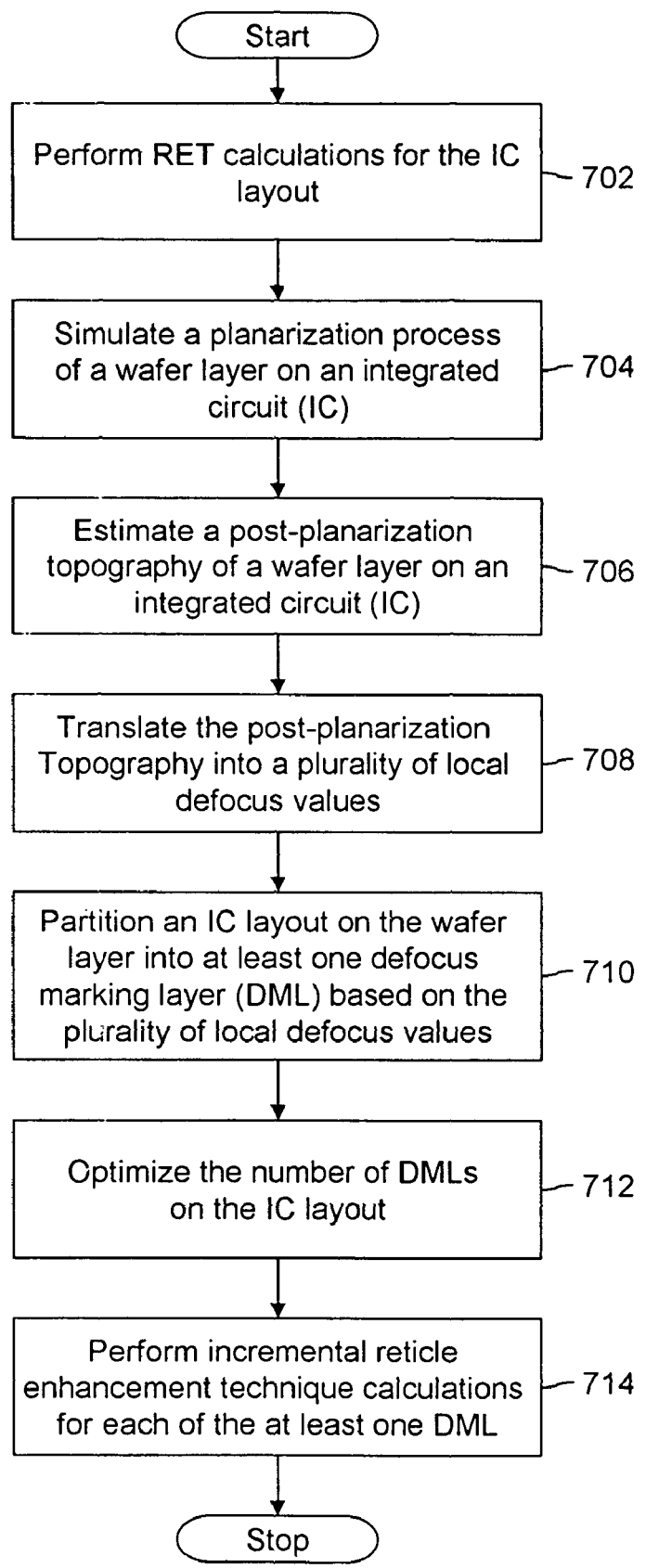
FIG. 7 is a flowchart illustrating a method for reticle enhancement, in accordance with another embodiment of the invention.

FIG. 7 is a flowchart illustrating a method for wafer topography-aware reticle enhancement, in accordance with another embodiment of the invention. At step 702, preliminary RET calculations are performed for an IC layout on a wafer layer. Examples of preliminary RET calculations include, optical proximity correction, phase-shifting, sub-resolution assist features, and the like. Preliminary RET calculations are performed using RET models. These RET calculations are conventional in the sense that they do not account for topography variations and are hence inaccurate. Such RET calculations can be performed by any existing commercial RET tool. At step 704, a planarization process of the wafer layer is simulated. In one embodiment of the invention, a chemical-mechanical process (CMP) is simulated. At step 706, a post-planarization topography map of the wafer layer is generated. Thereafter, at step 708, the post-planarization topography map is translated into local defocus values. At step 710, the IC layout is partitioned into at least one DML based on the plurality of defocus values. At step 712, the number of DMLs and/or the assignment of layout features to DMLs of the IC layout is optimized. The optimization is based on the design constraints and the available defocus specific RET models. Thereafter, at step 714, incremental RET calculations are performed for each of the at least one DML to improve the preliminary RET calculations performed at step 702. Incremental RET calculations may include, for example, sizing certain layout features such that the layout features are printed on the wafer layer correctly even after the defocus. Such RET calculations are typically small local perturbations of the preliminary RET calculations to correct the RET for topography variations. In this case, topography-aware RET flow is a post-processing step. Since incremental RET solution is "centered" around the preliminary RET solution, it differs from it only in a minimal way. The advantages of such an incremental RET are (1) it can be less runtime overhead since incremental RET can be purely rule-based instead of model-based (2) the RET models for defocus need not be very accurate in this case as they are used to compute only the delta between best focus and defocus conditions. In one embodiment of the invention, the incremental RET calculations are design based, i.e., they are based on design parameters such as setup timing slack, hold time slack, total negative timing slack, total leakage power, maximum clock frequency, or signal integrity. The above method is different from the method described in conjunction with FIG. 5 and FIG. 6 as preliminary RET calculations, i.e., RET calculations without taking into account the thickness variations in the wafer layer, are corrected based on the thickness variations.

The methods described in conjunction with FIG. 4, FIG. 5, FIG. 6, and FIG. 7 can be used for manufacturing of an integrated circuit. The reticle enhancement methods described above take into account the post-planarization height variations in a wafer layer. This increases the accuracy of patterns to be printed on the wafer layer to make the integrated circuit, which in turn, increases the performance of the integrated circuit.

Figure 8:
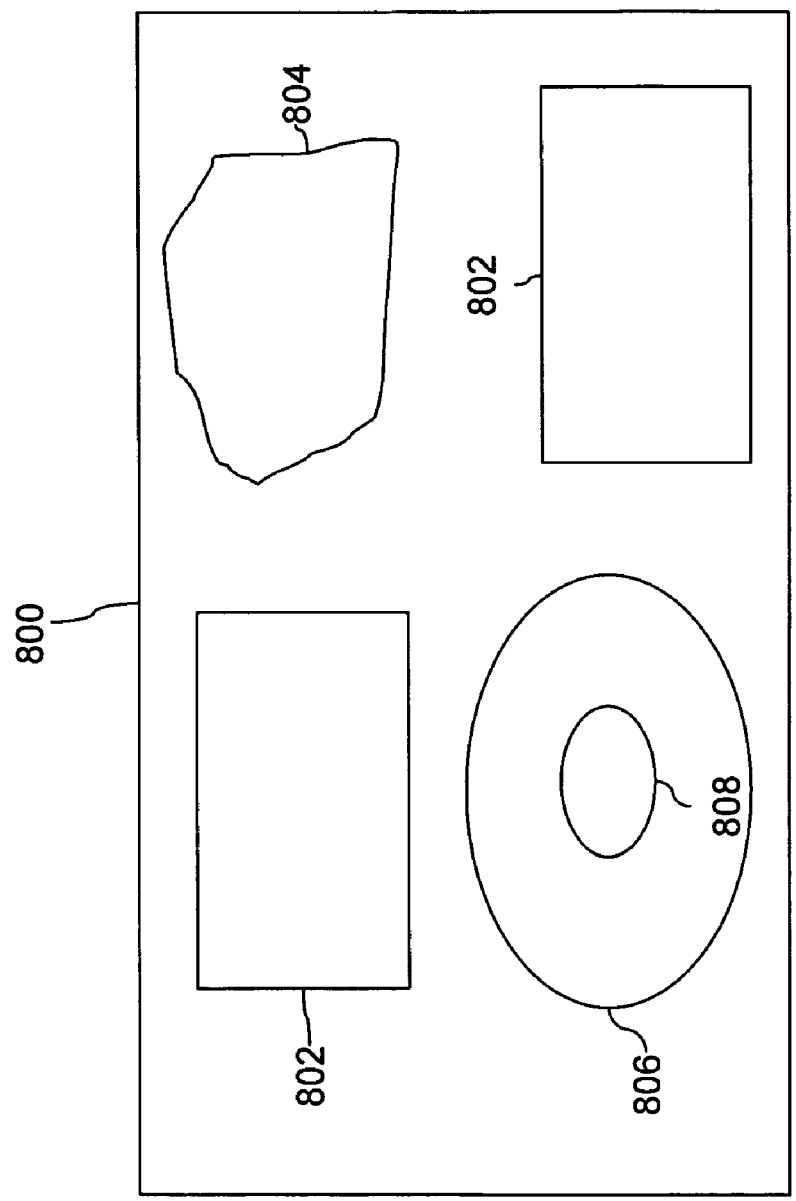
FIG. 8 is a block diagram of an IC layout partitioned into defocus marking layers, in accordance with an embodiment of the invention.

FIG. 8 is a block diagram of an IC layout 800 partitioned into defocus marking layers, in accordance with an embodiment of the invention. It is found after performing a CMP process that there is a topographic variation across IC layout 800. IC Layout 800 is, therefore, partitioned (as described in conjunction with FIG. 4 and FIG. 5) into four DMLs 802, 804, 806 and 808 based on thickness variations and design constraints. DMLs 802, 804, 806 and 808 are indicated by different patterns in FIG. 8. Different RET models are used for performing RET calculations for DMLs 802, 804, 806 and 808. This reduces the linewidth variation caused by focus variations due to topographic variations in the wafer layer, leading to an increase in the parametric yield and a significant reduction in edge placement errors. It will be apparent to those skilled in the art that the method for performing RET calculations as described in conjunction with FIG. 7 can also be used to reduce the focus variations caused due to topographic variations in the wafer layer.

Figure 9:
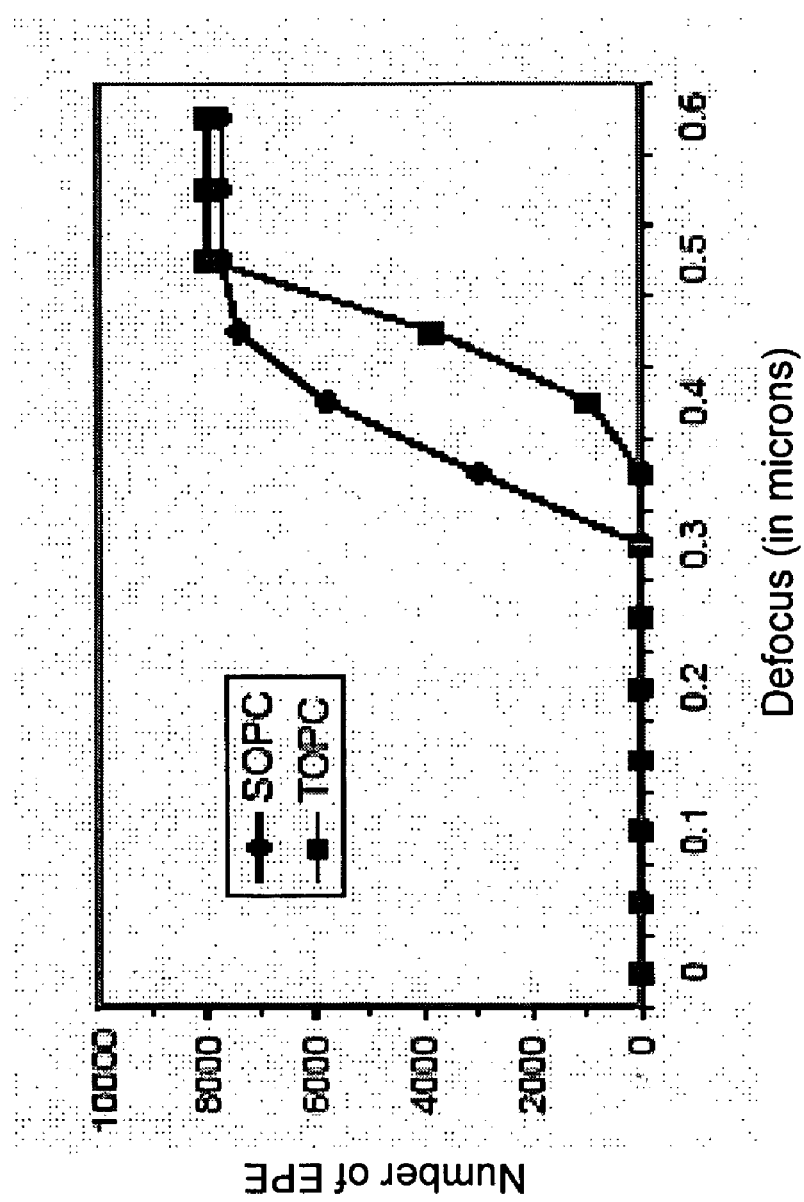
FIG. 9 is a graph illustrating the difference between standard OPC (SOPC) solution and topography aware OPC (TOPC) solution for reticle enhancement, in accordance with an embodiment of the invention.

FIG. 9 is a graph that illustrates the difference between Standard OPC (SOPC) solution and Topography aware OPC (TOPC) solution for reticle enhancement, in accordance with various embodiments of the invention. The number of edge placement errors (EPE) greater than 10 percent of the drawn critical dimension is plotted on the Y-axis, and the defocus values for a wafer layer are plotted on the X-axis. For defocus values of ±0.3 μm, the graph indicates that the number of EPEs can be reduced by up to 90% when TOPC calculations are performed for reticle enhancement, as compared to when SOPC calculations are performed.

The system for reticle enhancement during manufacturing of an integrated circuit, as described in the present invention or any of its components, may be embodied in the form of a computer system. Typical examples of a computer system includes a general-purpose computer, a programmed microprocessor, a micro-controller, a peripheral integrated circuit element, and other devices or arrangements of devices that are capable of implementing the steps that constitute the method of the present invention.

The method and system described have a number of advantages. The method considerably reduces the errors in transfer of an IC layout on a wafer layer, thereby increasing the parametric yield in the manufactured IC, and reducing the CD variations. The topographic variations in the wafer layer are incorporated in the RET calculations. This improves the design of photomasks. Further, the performance characteristics of an IC are also improved.

The computer system comprises a computer, an input device, a display unit and the Internet. The computer further comprises a microprocessor. The microprocessor is connected to a communication bus. The computer also includes a memory. The memory may include Random Access Memory (RAM) and Read Only Memory (ROM). The computer system further comprises a storage device. The storage device can be a hard disk drive or a removable storage drive such as a floppy disk drive, optical disk drive, etc. Any of the forgoing storage devices can be supplemented by, or incorporated in, ASICs (application-specific integrated circuits) and other forms of hardware. The storage device can also be other similar means for loading computer programs or other instructions into the computer system. The computer system also includes a communication unit. The communication unit allows the computer to connect to other databases and the Internet through an I/O interface. The communication unit allows the transfer as well as reception of data from other databases. The communication unit may include a modem, an Ethernet card, or any similar device, which enables the computer system to connect to databases and networks such as LAN, MAN, WAN and the Internet. The computer system facilitates inputs from a user through input device, accessible to the system through I/O interface.

The computer system executes a set of instructions that are stored in one or more storage elements, in order to process input data. The storage elements may also hold data or other information as desired. The storage element may be in the form of an information source or a physical memory element present in the processing machine.

The set of instructions may include various commands that instruct the processing machine to perform specific tasks such as the steps that constitute the method of the present invention. The set of instructions may be in the form of a software program. Each software program can be implemented in high-level procedural or object-oriented programming language or in assembly or machine language if desired; and in any case, the language can be a compiled or interpreted language. Further, the software may be in the form of a collection of separate programs, a program module with a larger program or a portion of a program module, as in the present invention. The processing of input data by the processing machine may be in response to user commands, results of previous processing or a request made by another processing machine.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

The invention claimed is:

1. A computer implemented method for reticle enhancement during manufacturing of an integrated circuit (IC), the method comprising the steps of:
   estimating post-planarization topography of a wafer layer of an IC using a processor of the computer, wherein the estimated post-planarization topography provides values of thickness variations in the wafer layer, the values of thickness variations defining different focus values on each of a plurality of defocus marking layers within the wafer layer;
   performing reticle enhancement technique (RET) calculations based on the values of thickness variations in each defocus marking layer of the wafer layer provided by the estimated post-planarization topography of the wafer layer to derive a correction; and
   incorporating the corrections resulting from the reticle enhancement technique calculations to a layout for a photomask used to transfer a pattern to the wafer layer.

2. The method according to claim 1, wherein the step of estimating the post-planarization topography comprises simulating a planarization process of the wafer layer.

3. The method according to claim 2, wherein the planarization process of the wafer layer is a chemical mechanical planarization (CMP) process.

4. The method according to claim 1, wherein the post-planarization topography is estimated using mathematical models.

5. The method according to claim 1 further comprising the step of translating the post-planarization topography into a plurality of defocus values.

6. The method according to claim 1, wherein the reticle enhancement technique is selected from one or more of a group consisting of optical proximity correction (OPC), sub-resolution assist features (SRAFs), and phase-shifting masks (PSM).

7. The method according to claim 1, wherein the method is embodied in an Electronic Design Automation tool.

8. The method according to claim 1, wherein the method is embodied in a photolithography tool.

9. An integrated circuit manufactured utilizing the reticle enhancement method of claim 1.

10. The method of claim 1, wherein the correction is a defocus value.

11. A system for reticle enhancement during manufacturing of an integrated circuit (IC), the system comprising:
    a simulator, the simulator generating an estimated post-planarization topography of a wafer layer on the IC, wherein the estimated post-planarization topography provides values of thickness variations in the wafer layer, the values of thickness variations defining different focus values at each of a plurality of defocus marking layers within the wafer layer; and a calculation module, the calculation module performing reticle enhancement technique (RET) calculations based on the values of thickness variations on each of the defocus marking layer in the wafer layer provided by the estimated post-planarization topography of the wafer layer to derive a correction, wherein the RET calculations are used to incorporate corrections for a layout of a photomask used to transfer a pattern to the wafer layer.

12. The system according to claim 11 further comprising an analysis engine, the analysis engine translating the post-planarization topography into a plurality of defocus values.

13. The system according to claim 11 further comprising a database, the database storing at least one RET model.

14. The method of claim 11, wherein the correction is a defocus value.

15. A computer program product for use with a computer, the computer program product comprising a computer storage device usable medium having a computer readable program code embodied therein for reticle enhancement during manufacturing of an integrated circuit (IC), the computer readable program code performing the steps of:

estimating a post-planarization topography of a wafer layer on the IC, wherein the estimated post-planarization topography provides values of thickness variations in the wafer layer, the values of thickness variations defining different focus values on each of a plurality of defocus marking layers within the wafer layer;

performing reticle enhancement technique (RET) calculations based on the values of thickness variations on each defocus marking layer in the wafer layer provided by the estimated post-planarization topography of the wafer layer to derive a correction; and incorporating the corrections resulting from the reticle enhancement technique calculations to a layout for a photomask used to transfer a pattern to the wafer layer.

16. The computer program product according to claim 15 further comprising computer readable program code for performing the step of translating the post-planarization topography into a plurality of local defocus values.

17. The computer program product according to claim 15, wherein the computer readable program code performing the step of estimating the post-planarization topography comprises computer readable program code for performing the step of simulating a planarization process of the wafer layer.

18. The computer program product of claim 15, wherein the correction is a defocus value.

* * * * *